United States Patent
Guillot

(10) Patent No.: US 9,948,356 B2
(45) Date of Patent: Apr. 17, 2018

(54) POWER/DATA ELECTRICAL COUPLER

(71) Applicant: SAFRAN ELECTRONICS & DEFENSE SAS, Boulogne Billancourt (FR)

(72) Inventor: François Guillot, Boulogne Billancourt (FR)

(73) Assignee: SAFRAN ELECTRONICS & DEFENSE SAS, Boulogne Billancourt (FR)

( * ) Notice: Subject to any disclaimer, the term of this patent is extended or adjusted under 35 U.S.C. 154(b) by 0 days.

(21) Appl. No.: 15/555,342

(22) PCT Filed: Mar. 23, 2016

(86) PCT No.: PCT/EP2016/056324
§ 371 (c)(1),
(2) Date: Sep. 1, 2017

(87) PCT Pub. No.: WO2016/150989
PCT Pub. Date: Sep. 29, 2016

(65) Prior Publication Data
US 2018/0041249 A1    Feb. 8, 2018

(30) Foreign Application Priority Data

Mar. 25, 2015 (FR) .................................... 15 52499

(51) Int. Cl.
*H04B 3/00* (2006.01)
*H04B 3/56* (2006.01)
(Continued)

(52) U.S. Cl.
CPC .............. *H04B 3/56* (2013.01); *H01F 38/14* (2013.01); *H03H 7/0138* (2013.01); *H03H 7/09* (2013.01);
(Continued)

(58) Field of Classification Search
CPC .............. H04B 2203/5483; H04B 3/56; H04B 2203/5491; H04B 3/542; H04L 25/0266;
(Continued)

(56) References Cited

U.S. PATENT DOCUMENTS

| 2010/0264727 A1 | 10/2010 | Riedel et al. |
| 2015/0109073 A1 | 4/2015 | Guillot et al. |

FOREIGN PATENT DOCUMENTS

| DE | 10 2008 007023 A1 | 8/2009 |
| FR | 2 993 106 A1 | 1/2014 |

OTHER PUBLICATIONS

May 13, 2016 Search Report issued in International Patent Application No. PCT/EP2016/056324.

*Primary Examiner* — Zewdu Kassa
(74) *Attorney, Agent, or Firm* — Oliff PLC; R. Brian Drozd

(57) ABSTRACT

An electrical coupler includes: a sending transformer having a winding for receiving data signals and two windings connected in series with a common point and two terminals to be connected to a first wires pair of a bus to deliver the data signals at the first winding terminals to said wire pair; a receiving transformer having two windings connected in series with a common point and two terminals to be connected to a second pair of wires of said bus to receive data signals on the pair of wires and a winding for delivering said data signals; and a galvanic isolation transformer with a first winding, the terminals of which are connected to the coupler's power supply pins, and second and third windings connected in series with a common point connected to a mechanical ground and the respective free terminals connected to the common terminals of sending and receiving transformers.

6 Claims, 4 Drawing Sheets

(51) Int. Cl.
  *H01F 38/14* (2006.01)
  *H04B 3/54* (2006.01)
  *H03H 7/01* (2006.01)
  *H04L 25/02* (2006.01)
  *H03H 7/09* (2006.01)

(52) U.S. Cl.
  CPC ......... *H04B 3/542* (2013.01); *H04L 25/0266* (2013.01); *H04L 25/0276* (2013.01); *H04B 2203/5416* (2013.01); *H04B 2203/5429* (2013.01)

(58) Field of Classification Search
  CPC ............. H04L 25/0272; H04L 25/0292; H04L 25/028; H04L 25/08; H04L 7/0008
  USPC .................. 375/258, 257, 295, 219, 316
  See application file for complete search history.

POWER/DATA ELECTRICAL COUPLER

The present invention relates to a power/data electrical coupler. Such an electrical coupler is designed to send, over a bus, data signals delivered by a peripheral and to receive data signals from said bus and deliver them to a peripheral. Provision is also made for delivering an alternating supply voltage to said bus or to receive it from said bus. Such a power/data coupler is for example used for coupling electrical actuators, via a bus, to control units and to power supplies by forming a data and power-supply transport network. Such networks are for example installed on aircraft.

Various embodiments of such power/data electrical couplers are known and reference can be made, by way of examples, to those that are described in the patent publications DE 102008007023 and FR 2993106. Another equivalent embodiment is described in relation to FIG. 1 in order better to present the problem that the present invention seeks to solve.

Figure 1:
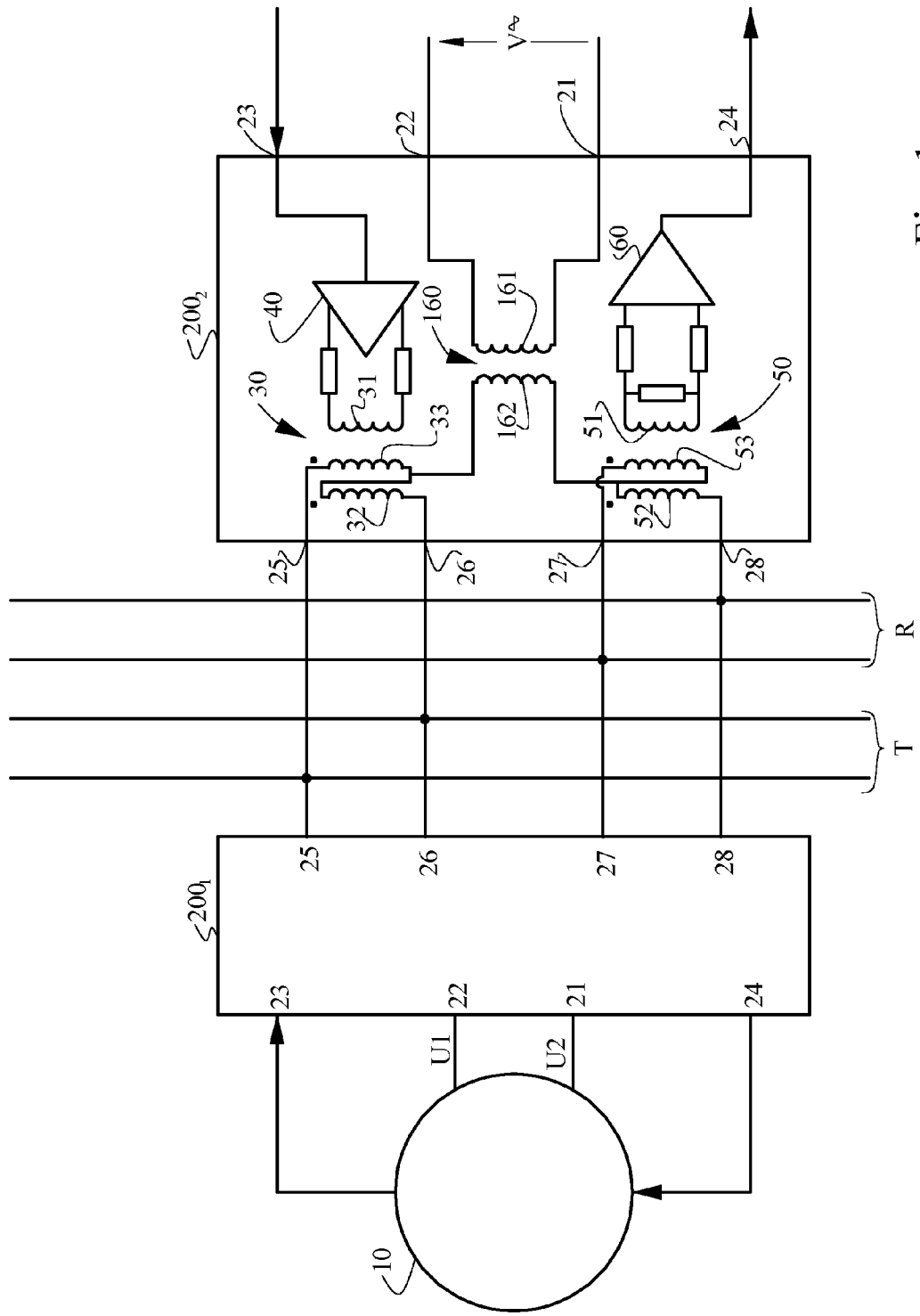

FIG. 1 shows such a data and power-supply transport network. This network comprises an actuator 10 and two power/data electrical couplers 200₁ and 200₂ according to the prior art. The actuator 10 is connected to the electrical coupler 200₁, firstly in order to be supplied thereon with power by power supply pins 21 and 22 of the electrical coupler 200₁ and, secondly, to send data over the network via the pin 23, or to receive data from the network via the pin 24. Likewise, the electrical coupler 200₂ comprises power supply pins 21 and 22 intended to be connected either to the power supply terminals of another actuator (not shown) or to the terminals of a power supply source (not shown). It also comprises pins 23 and 24 for respectively receiving and sending data, for example from a peripheral such as an actuator or a control unit such as a computer. The electrical couplers 200₁ and 200₂ are connected, via respective pins 25, 26, 27 and 28, to a bus B consisting of two pairs of wires T and R for firstly the respective transport of the data that are sent by a peripheral and data that are intended for other peripherals and secondly the flow of the power supply current delivered by the power supply source or sources connected to the network and supplied to the actuators connected to the network. Electrical couplers other than those shown may be connected to the bus B for other actuators or peripherals. As will be seen hereinafter, whereas the data are transported on each of the pairs of wires T and R in differential mode, the supply current for its part is transported in common mode.

The structure of the electrical coupler 200₂ is detailed. This structure is the same for all the electrical couplers in the network. It comprises a first transformer 30, referred to as the sending transformer, the terminals of a winding 31 of which are connected, via respective impedance matching resistors, to two outputs of an amplifier 40 receiving at its input data signals present on the pin 23. This winding 31 creates a magnetic flux that excites two other identical windings 32 and 33 of the sending transformer 30. These windings 32 and 33 are connected in series with each other with a common terminal and two other terminals connected to the pins 25 and 26 and thus to the pair of wires T of the bus B. They are wound so that they receive the same magnetic flux from the winding 31 and deliver the same signal at their own terminals (see the representation for this purpose by two symbolic dots).

The electrical coupler 200₂ also comprises a second transformer 50, referred to as a receiving transformer, two identical windings 52 and 53 of which are connected in series with each other with a first common terminal and two other terminals connected to the pins 27 and 28 and thus to the pair of wires R of the bus B. It comprises a third winding 51, the terminals of which are connected, via impedance matching resistors, to the inputs of an amplifier 60, the output of which is connected to the pin 24 of the electrical coupler 200₂ in order to deliver data to a peripheral. The windings 52 and 53 are wound so that their magnetic fluxes are added in order to excite the winding 51 (see the symbolic dots for this purpose).

It also comprises a galvanic isolation transformer 160, a winding 161 of which is connected to the power supply pins 22 and 21 to which there is connected either a peripheral in order to be supplied therefrom, or an alternating voltage supply source V. As for the winding 162 of the transformer 160, it has a terminal that is connected to the common terminal of the windings 32 and 33 of the sending transformer 30 and the other terminal that is connected to the common terminal of the windings 52 and 53 of the receiving transformer 50.

It should be noted that the galvanic isolation transformer 160 could be not included in the electrical coupler 200₂ as shown in FIG. 1 but on the contrary be mounted at a distance from this electrical coupler 200₂.

When a power supply source is connected to the power supply pins 21 and 22, the voltage that it delivers is found at the terminals of the winding 161 of the galvanic isolation transformer 160, and then, to within a transformation factor of the transformer 160 (generally equal to 1), at the terminals of its winding 162. Thus the potential of one of the terminals of the winding 162 is found on the common terminal of the windings 32 and 33 of the sending transformer 30 and therefore on each of the wires of the pair of wires T of the bus B whereas the potential of the other terminal of the winding 162 is found on the common terminal of the windings 52 and 53 of the receiving transformer 50 and therefore on each of the wires of the pair of wires R of the bus B. Conversely, when an actuator is connected to the supply pins 21 and 22 in order to be supplied therefrom, the potential present on each of the wires of the pair T is found at the common point of the windings 32 and 33 and therefore on a first terminal of the winding 162 whereas the potential present on each of the wires of the pair R is found at the common point of the windings 52 and 53 and therefore on the other terminal of the winding 162 of the transformer 160. The result of this is a power supply voltage at the terminals of the winding 161 of the transformer 160 and therefore on the power supply pins 21 and 22. This is common mode.

The data signals present on the pin 23, after amplification by the amplifier 40, excite the winding 31 of the sending transformer 30, which generates a magnetic flux that is captured by the windings 32 and 33, which, on the respective wires of the pair of windings T of the bus B, generate data signals of opposite amplitudes. Likewise, the data signals of opposite amplitudes respectively present on the wires of the pair of wires R of the bus B are found at the terminals of the windings 52 and 53 of the receiving transformer 30, which generates magnetic fluxes then exciting the winding 51, which then generates a data signal which, after amplification, is supplied to the pin 24 intended for a peripheral. This is then differential mode.

Thus the data are transported on each of the pairs of wires T and R in differential mode whereas the power supply current, in one direction or the other, is for its part transported in common mode.

The power supply voltage is alternating, of relatively low frequency (for example less than 1 MHz) compared with the transmission frequency of the data (for example a few hundreds of MHz, for a transmission of the Ethernet type.

This particular structure of the electrical coupler, such as the electrical couplers $200_1$ and $200_2$ in FIG. 1, may pose problems when parasitic currents flow on the pairs of wires T or R. This may in particular be the case in the presence of lightning or during high-frequency tests such as those that are recommended by the standard DO-160. These parasitic currents, generally transmitted in common mode in the windings 32 and 33 of the sending transformer 30 and the windings 52 and 53 of the receiving transformer 30, are found at the terminals of the winding 162 of the galvanic isolation transformer 160 and therefore at the terminals of its winding 161 and also on the power supply pins 21 and 22. They may then damage the actuators or the power supply sources that are connected thereto.

The aim of the present invention is to propose an electrical coupler such as the one that has just been described in relation to FIG. 1 but which is of a structure such that it makes it possible to solve the problems mentioned above To do this, the present invention relates to a power/data electrical coupler that comprises:
  a sending transformer consisting of a winding for receiving data signals and two windings connected in series with each other with a common point and two terminals intended to be connected to a first pair of wires T of a bus in order to deliver to said pair of wires, in differential mode, the data signals present at the terminals of the first winding, and
  a receiving transformer consisting of two windings connected in series with each other with a common point and two terminals intended to be connected to a second pair of wires R of said bus in order to receive, in differential mode, data signals present on the pair of wires of the bus and a winding for delivering said data signals.

It also comprises a galvanic isolation transformer that itself comprises a first winding the terminals of which are connected to the power supply pins of said coupler and second and third windings connected in series with each other with a common point connected to a mechanical ground and the respective free terminals connected to the common terminal of the windings of the sending transformer and to the common terminal of the windings of the receiving transformer.

According to another advantageous feature of the present invention, said coupler further comprises an isolation transformer consisting of two identical windings coupled magnetically, the input terminals of which are respectively connected to the terminals of the winding of the galvanic isolation transformer and the output terminals of which are respectively connected to the supply pins of said electrical coupler.

According to another advantageous feature of the present invention, said coupler comprises capacitors respectively connected in parallel to the terminals of the windings of said isolation transformer forming, with said windings, rejection filters at a frequency corresponding to the or one resonant frequency of the sending and receiving transformers.

According to another advantageous feature of the present invention, the sending transformer comprises a fourth winding, the terminals of which are respectively connected to the first terminals of two identical windings, the second terminals of which are connected to a mechanical ground, and the receiving transformer comprises a fourth winding, the terminals of which are respectively connected to the first terminals of two identical windings the second terminals of which are connected to the mechanical ground.

According to another advantageous feature of the present invention, said coupler comprises an isolation transformer consisting of two identical magnetically coupled windings, the input terminals of which are intended to be connected to the pair of wires T and the output terminals of which are respectively connected to the terminals of the windings of the sending transformer, and an isolation transformer consisting of two identical magnetically coupled windings, the input terminals of which are intended to be connected to the pair of wires R and the output terminals of which are respectively connected to the terminals of the windings of the reception transformer.

The present invention also relates to a data and power supply transport network designed for coupling electrical actuators, via a bus consisting of two pairs of wires T and R, to peripherals and to power supplies, which is characterised in that it comprises at least two electrical couplers as just described.

Figure 2:
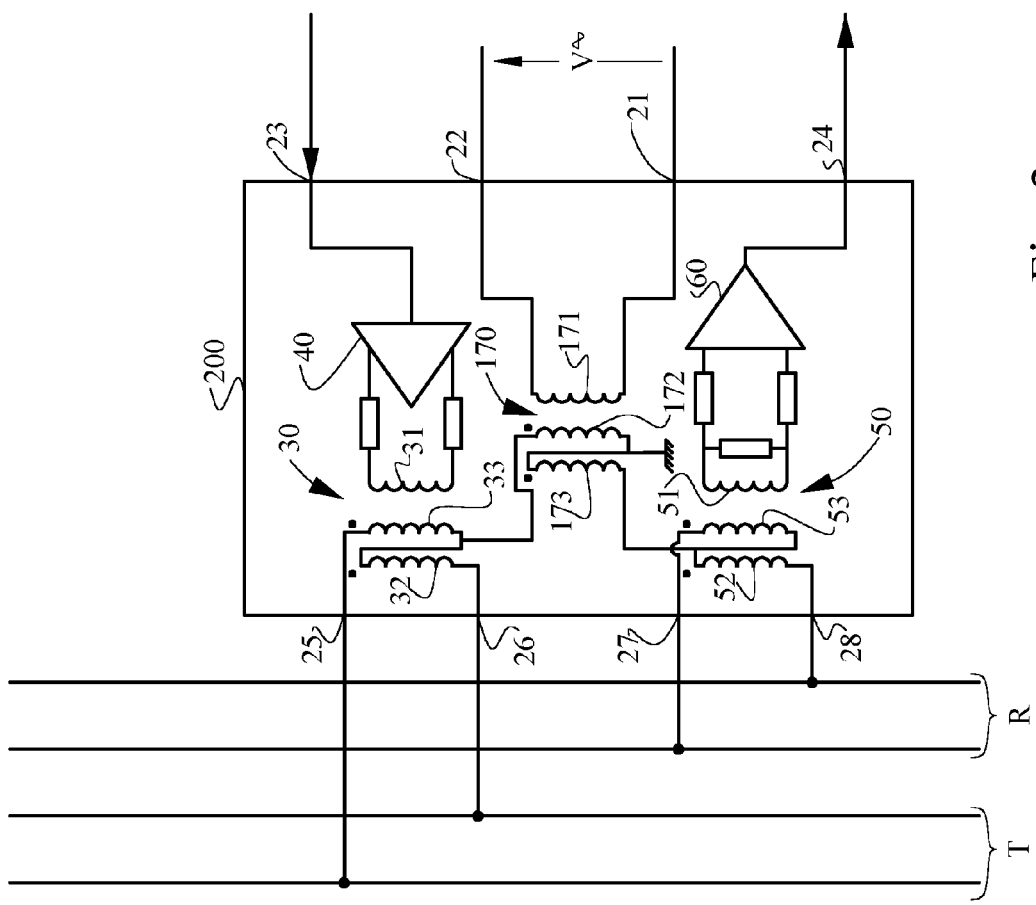
Figure 3:
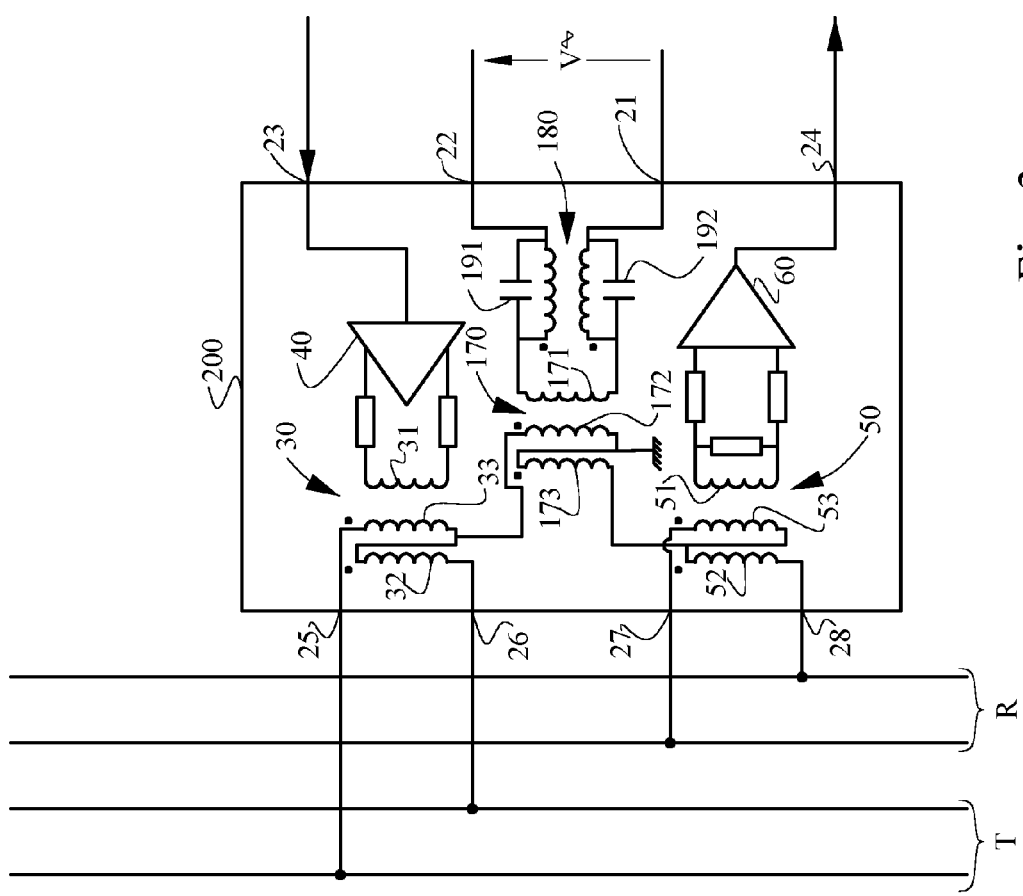
Figure 4:
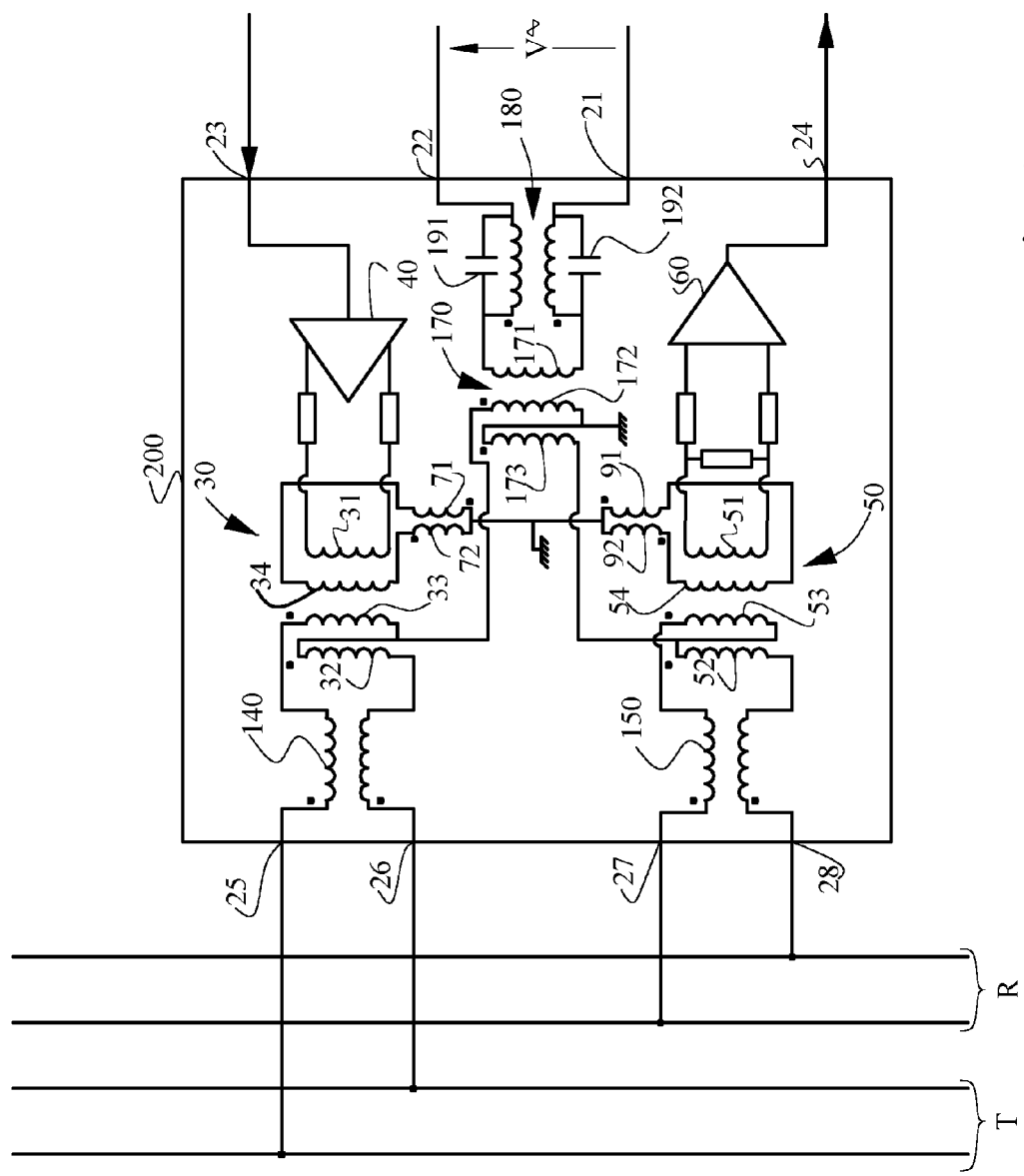

The features of the invention mentioned above, as well as others, will emerge more clearly from a reading of the following description of example embodiments, said description being given in relation to the accompanying drawings, among which:

FIG. 1 is a block diagram of a data and power supply transport network that incorporates an electrical coupler of the prior art, FIG. 2 is a block diagram of an electrical coupler according to a first embodiment of the present invention, FIG. 3 is a block diagram of an electrical coupler according to a second embodiment of the present invention, and FIG. 4 is a block diagram of an electrical coupler according to a third embodiment of the present invention.

An electrical coupler according to the present invention is intended to be implemented in the same way as the electrical couplers of the prior art, such as the couplers $200_1$ and $200_2$ that were shown in FIG. 1.

FIG. 2 therefore shows an electrical coupler 200 according to the first embodiment of the present invention. As can be seen, this electrical coupler 200 comprises the same pins as the electrical couplers $200_1$ and $200_2$ of FIG. 1, in particular pins 25 and 26 for sending data to a pair of wires T of a bus B of a network, pins 27 and 28 for receiving data from a pair of wires R of the bus B, power supply pins 21 and 22 for the connection, depending on the use made of the electrical coupler, either of a power supply source delivering an alternating supply voltage, or of a periphery in order to be supplied therefrom, and pins 23 and 24 for respectively receiving data sent by a peripheral such as an actuator or a control unit or for sending data to such a peripheral.

As can be seen, the electrical coupler 200 comprises elements that are already present in the electrical coupler $200_2$ of FIG. 1. These same elements therefore bear the same reference as at FIG. 1 and are not described again here.

The electrical coupler 200 differs from the one that is described in relation to FIG. 1 in that it comprises, instead of the galvanic isolation transformer 160 of the prior art, a galvanic isolation transformer 170 comprising a first winding 171, the terminals of which are connected to the power supply pins 21 and 22, and second and third windings 172 and 173 connected in series together with a common terminal connected to a mechanical ground (for example the mechanical ground of the apparatus in which the network is installed) and the other respective terminals connected to the common terminal of the windings 32 and 33 of the sending transformer 30 and to the common terminal of the windings 52 and 53 of the receiving transformer 50. The windings 172 and 173 are coupled magnetically to the winding 171. Moreover, they are wound so that they receive the same magnetic flux from the winding 171 and deliver the same signal at their own terminals (see the representation for this purpose by symbolic dots).

The functioning is as follows. The pair of wires T of the bus B is raised to an alternating potential that is switched, in common mode in the sending transformer 30, onto the free terminal of the second winding 172 of the transformer 170. The pair of wires R of the bus B for its part is raised to another alternating potential, which is also switched, in common mode in the receiving transformer 50, onto the free terminal of the third winding 173 of the transformer 170. These potentials being different, the transformer 170 functions in differential mode so that the difference in potential at the free terminals of the windings 172 and 173 is, to within the transformation factor of the transformer 170 (generally equal to 1), found at the terminals of the winding 171 and therefore on the power supply pins 21 and 22, developing a supply voltage V.

The parasitic currents that would be present on the wires of the pairs of wires T and R of the bus B, for example generated by lightning or injected during high-frequency tests or others, because they have substantially the same amplitude on each of the wires of the bus B, are switched, in common mode by the windings 32 and 33 of the sending transformer 30 on the one hand and by the windings 52 and 53 of the receiving transformer 50 on the other hand, to the terminals of the windings 172 and 173 of the transformer 170. Being in addition of equal amplitudes on these terminals, firstly they are switched in common mode onto the mechanical ground connected to the common point of these windings 172 and 173, and secondly have no effect in differential mode of the transformer 170 at the terminals of the winding 171. Thus any peripheral connected to the supply pins 21 and 22 is protected from these parasitic currents.

In the case of lightning or injection of high-frequency test signals, the parasitic signals in question may be of high frequency. The voltages involved may then be of high amplitude, in particular if the frequencies of these signals are situated in a frequency band including the resonant frequency or a resonant frequency of the sending and receiving transformers 30 and 50. These signals on each of the pairs of wires R and T of the bus B may not be of respective amplitudes that are strictly equal. Because of this, residues of these signals may be transmitted, in differential mode, to the winding 171 of the transformer 170 and therefore onto the power supply pins 21 and 22 of the coupler 200, which may disturb the apparatus connected to these pins 21 and 22.

The embodiment of an electrical coupler 200 shown in FIG. 3 makes it possible to solve this problem. It comprises an isolation transformer 180 consisting of two identical windings 181 and 182 coupled magnetically, the input terminals of which (marked by a dot) are respectively connected to the terminals of the winding 171 of the transformer 170 and the output terminals of which are respectively connected to the supply pins 21 and 22. The signals transmitted via this isolation transformer 180 in common mode are highly attenuated whereas the signals transmitted in differential mode are not.

In addition, in parallel to each of the windings 181, 182 of the transformer 180, capacitors 191 and 192 are connected, which then form, with the respective windings 181 and 182 of the transformer 180, rejection filters at a frequency, according to the invention, corresponding to the or a resonant frequency of the sending and receiving transformers 30 and 50.

The third embodiment shown in FIG. 4 differs from the second embodiment in that the sending transformer 30 now comprises a fourth winding 34, the terminals of which are respectively connected to the first terminals of two identical windings 71 and 72, the second terminals of which are connected to the mechanical ground (for example that of the apparatus in which the network is installed). The windings 71 and 72 are coupled magnetically and are wound in different directions (see symbolic dots relating to these windings). Likewise, the receiving transformer 50 comprises a fourth winding 54 the terminals of which are respectively connected to the first terminals of two identical windings 91 and 92 the second terminals of which are connected to the mechanical ground (for example that of the apparatus in which the network is installed). The windings 91 and 92 are magnetically coupled and are wound in different directions (see symbolic dots relating to these windings).

The winding 34 forms a capacitive screen between the winding 31 on the one hand and the windings 32 and 33 on the other hand, which has the effect of substantially increasing the resonant frequency F0 related to the parasitic capacitances of the sending transformer 30. Moreover, among the high-frequency currents that would be present on the wires of the pair of wires T, for example generated by lightning or injected during high-frequency tests, those that have a resonant frequency F0 are of high amplitude at the sending transformer 30. They excite the winding 34, which then switches them to the mechanical ground via the windings 71 and 72 which, in common mode, have low impedance. The amplifier 40 is thus protected against any overvoltage that may appear at the terminals of the winding 31 of the sending transformer 30. Outside these frequencies, the windings 71 and 72 have high impedance so that the winding 34 no longer forms a screen. The functioning of the amplifier 40 is then not disturbed.

Likewise, the winding 54 forms a capacitive screen between the winding 51 on the one hand and the windings 52 and 53 on the other hand, which has the effect of substantially increasing the resonant frequency F0 related to the parasitic capacitances of the receiving transformer 50. Likewise, among the high-frequency currents that would be present on the wires of the pair of wires R, for example generated by lightning or injected during high-frequency tests, those that have a resonant frequency F0 are amplified by resonance at the receiving transformer 50. They excite the winding 54, which then switches them to the mechanical ground via the windings 91 and 92 which, in common mode, have low impedance. Outside these frequencies, the windings 91 and 92 have high impedance so that the winding 54 no longer forms a screen.

In addition, the electrical coupler 200 that is shown in FIG. 4 comprises, for the pathway corresponding to the pair of wires T of the bus B, an isolation transformer 140 consisting of two identical windings coupled magnetically, the input terminals of which (marked by a dot) are connected to the pins 25 and 26 of the coupler intended to be connected to the pair of wires T and the output terminals of which are respectively connected to the terminals of the windings 32 and 33 of the sending transformer 30. The signals transmitted via this isolation transformer 140 in common mode, generally parasitic signals, are highly attenuated whereas the signals transmitted in differential mode, here the data signals, are not. Likewise, for the pathway corresponding to the pair of wires R of the bus, the electrical coupler 200 of FIG. 5 comprises an isolation transformer 150 with a structure and functioning identical to those of the isolation transformer 140.

The electrical couplers that are the subjects of FIGS. 2 and 4 are designed for a low-frequency alternating power supply (for example below 1 MHz, that is to say lower by several orders of magnitude than the frequency of the data signals (for example greater than 100 MHz).

The invention claimed is:

1. A power/data electrical coupler comprising:
   a sending transformer comprising a winding for receiving data signals and two windings connected in series with each other with a common point and two terminals intended to be connected to a first pair of wires of a bus in order to deliver to said pair of wires, in differential mode, the data signals present at the terminals of the first winding,
   a receiving transformer comprising of two windings connected in series with each other with a common point and two terminals intended to be connected to a second pair of wires of said bus in order to receive, in differential mode, data signals present on the pair of wires of the bus and a winding for delivering said data signals, and
   a galvanic isolation transformer that comprises a first winding the terminals of which are connected to the power supply pins of said coupler and second and third windings connected in series with each other with a common point connected to a mechanical ground and the respective free terminals connected to the common terminal of the windings of the sending transformer and to the common terminal of the windings of the receiving transformer.

2. The electrical coupler according to claim 1, further comprising an isolation transformer comprising of two identical windings coupled magnetically, the input terminals of which are respectively connected to the terminals of the winding of the galvanic isolation transformer and the output terminals of which are respectively connected to the supply pins of said electrical coupler.

3. The electrical coupler according to claim 2, further comprising capacitors respectively connected in parallel to the terminals of the windings of said isolation transformer forming, with said windings, rejection filters at a frequency corresponding to the or one resonant frequency of the sending and receiving transformers.

4. The electrical coupler according to claim 1, wherein the sending transformer comprises a fourth winding, the terminals of which are respectively connected to the first terminals of two identical windings, the second terminals of which are connected to a mechanical ground, and the receiving transformer comprises a fourth winding, the terminals of which are respectively connected to the first terminals of two identical windings, the second terminals of which are connected to the mechanical ground.

5. The electrical coupler according to claim 1, further comprising an isolation transformer comprising of two identical magnetically coupled windings, the input terminals of which are intended to be connected to the pair of wires and the output terminals of which are respectively connected to the terminals of the windings of the sending transformer and an isolation transformer comprising of two identical magnetically coupled windings, the input terminals of which are intended to be connected to the pair of wires and the output terminals of which are respectively connected to the terminals of the windings of the reception transformer.

6. A data and power supply transport network provided for coupling electrical actuators, via a bus comprising of two pairs of wires, to peripherals and power supplies, wherein it comprises at least two electrical couplers according to claim 1.

* * * * *